(12) United States Patent
Wolf

(10) Patent No.: US 7,502,602 B2
(45) Date of Patent: Mar. 10, 2009

(54) METHOD AND APPARATUS TO COMPENSATE LOOP ERROR OF PHASE LOCKED LOOP

(75) Inventor: Guy Wolf, Petach Tikva (IL)

(73) Assignee: Intel Corporation, Santa Clara, CA (US)

( * ) Notice: Subject to any disclaimer, the term of this patent is extended or adjusted under 35 U.S.C. 154(b) by 387 days.

(21) Appl. No.: 11/183,835

(22) Filed: Jul. 19, 2005

(65) Prior Publication Data

US 2007/0021084 A1    Jan. 25, 2007

(51) Int. Cl.
*H04B 1/06* (2006.01)

(52) U.S. Cl. ............ 455/260; 455/183.1; 455/76; 455/165.1; 455/192.1; 375/376; 375/344; 327/156; 327/147; 327/105; 331/175; 332/127

(58) Field of Classification Search ........... 455/260, 455/91, 103, 180.3, 260.76, 73, 116, 118, 455/303, 183.1, 255, 165.1, 265, 75, 147, 455/264, 192.1, 316; 375/302, 376, 259, 375/295, 215, 219, 272, 146, 274, 273, 303, 375/305, 308, 344, 307, 373, 375; 331/18, 331/16, 158, 175, 25; 327/156, 105, 47, 327/57, 17, 181, 175, 177, 147, 117, 162; 332/127, 2, 17, 25

See application file for complete search history.

(56) References Cited

U.S. PATENT DOCUMENTS

| | | | | |
|---|---|---|---|---|
| 4,912,432 A | * | 3/1990 | Galani et al. ............... 331/2 |
| 5,727,038 A | * | 3/1998 | May et al. ............... 375/376 |
| 6,008,703 A | | 12/1999 | Perott et al. | |
| 6,239,660 B1 | * | 5/2001 | Dekker .................. 331/18 |
| 6,255,912 B1 | * | 7/2001 | Laub et al. ............... 331/25 |
| 6,560,297 B1 | * | 5/2003 | Broughton .............. 375/308 |
| 6,766,178 B1 | * | 7/2004 | Damgaard et al. ....... 455/552.1 |
| 6,809,598 B1 | * | 10/2004 | Staszewski et al. ........ 331/16 |
| 7,027,780 B2 | * | 4/2006 | Jensen .................. 455/91 |
| 2003/0109234 A1 | * | 6/2003 | Shi ..................... 455/116 |
| 2003/0129955 A1 | * | 7/2003 | Gilmore ................ 455/303 |
| 2004/0125904 A1 | * | 7/2004 | Sofianos et al. ............ 375/376 |
| 2004/0202271 A1 | * | 10/2004 | Fahim .................. 375/376 |
| 2005/0041766 A1 | * | 2/2005 | Thompson .............. 375/376 |
| 2005/0130700 A1 | * | 6/2005 | Gardenfors et al. ....... 455/550.1 |
| 2006/0209986 A1 | * | 9/2006 | Jensen et al. ............ 375/302 |
| 2006/0242445 A1 | * | 10/2006 | Aweya et al. ............ 713/400 |

OTHER PUBLICATIONS

Perrott "A modeling Approach for Fractional- N freqency Synthesizers Allowing Straightforward Noise Analysis", IEEE Journal of Solid-State Circuits, vol. 37, No. 8, Aug. 2002, pp. 1028-1038.*
Perrott et al. "A Modeling Approach for $\Sigma$-$\Delta$ Fractional-$N$ Frequency Synthesizers Allowing Straightforward Noise Analysis", IEEE Journal of Solid-State Circuits, vol. 37, No. 8, Aug. 2002, pp. 1028-1038.

(Continued)

*Primary Examiner*—Edward Urban
*Assistant Examiner*—Junpeng Chen
(74) *Attorney, Agent, or Firm*—Kacvinsky LLC

(57) ABSTRACT

Briefly, according to embodiments of the invention, there is provided a method and an apparatus to compensate for a closed loop response error of a transfer function of a phase locked loop unit.

24 Claims, 2 Drawing Sheets

OTHER PUBLICATIONS

Margarit et al., "A Low Power High Spectral Purity Frequency Translational Loop for Wireless Applications", IEEE 2000 Custom Integrated Circuits Conference pp. 593-596.

Hsu, June-Ming, "A 0.18-μm CMOS Offset-PLL Upconversion Modulation Loop IC for DCS1800 Transmitter", IEEE Journal of Solid-State Circuits, vol. 38, No. 4, Apr. 2003, pp. 603-613.

* cited by examiner

METHOD AND APPARATUS TO COMPENSATE LOOP ERROR OF PHASE LOCKED LOOP

BACKGROUND OF THE INVENTION

Transmitters and/or receivers of wireless communication systems such as, for example, a cellular radio communication system, wireless local area network (WLAN) and the like, may include an offset phase locked loop (OPLL) unit. The OPLL may receive for example a Gaussian minimum shift keying (GMSK) modulated signal and may upconvert the GMSK signal into a radio frequency (RF) signal. The RF signal may be transmitted by a transmitter. For example, in a cellular radio transmitter, an OPLL unit may be used to upconvert an intermediate frequency (IF) signal into the RF signal.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
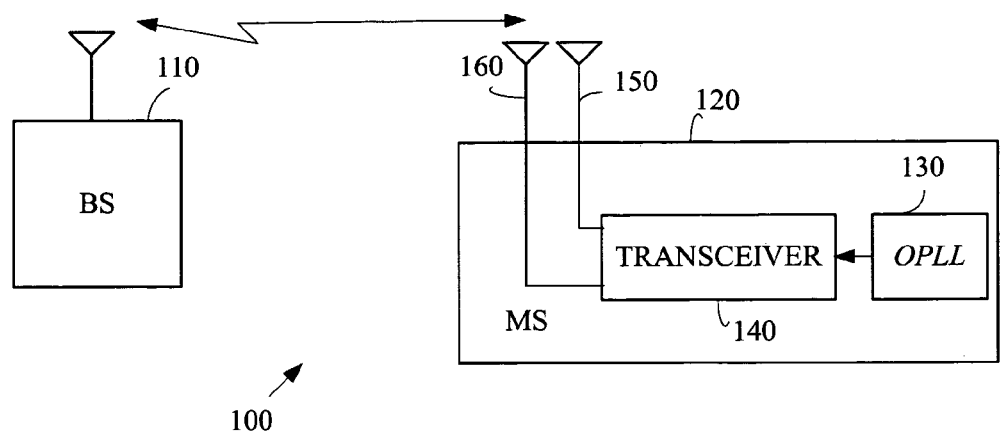
FIG. 1 is a schematic illustration of a wireless communication system according to an exemplary embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the present invention may be practiced without these specific details. In other instances, well-known methods, procedures, components, and circuits have not been described in detail so as not to obscure the present invention.

Some portions of the detailed description, which follow, are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices. In addition, the term "plurality" may be used throughout the specification to describe two or more components, devices, elements, parameters and the like. For example, "plurality of mobile stations" describes two or more mobile stations.

It should be understood that the present invention may be used in a variety of applications. Although the present invention is not limited in this respect, the circuits and techniques disclosed herein may be used in many apparatuses such as transmitters and/or receivers of a radio system. Transmitters and/or receivers intended to be included within the scope of the present invention may be included, by way of example only, within a wireless local area network (WLAN), two-way radio communication system, digital communication system, analog communication system transmitters, cellular radiotelephone communication system, and the like.

Types of cellular radiotelephone communication system intended to be within the scope of the present invention include, although are not limited to, Wideband Code Division Multiple Access (WCDMA), Global System for Mobile communication (GSM), General Packet Radio Service (GPRS), extended GPRS extended data rate for global evolution (EDGE), and the like.

Turning to FIG. 1, a wireless communication system 100 in accordance with exemplary embodiment of the invention is shown. Although the scope of the present invention is not limited in this respect, wireless communication system may include at least one base station (BS) 110 and at least one mobile station 120. In this exemplary embodiment of the invention, MS 120 may include a PLL 130, a transceiver 140 and antennas 150 and 160.

Although the scope of the present invention is not limited in this respect types of antennas that may be used for antenna 150 and/or antenna 160 may include an internal antenna, a dipole antenna, an omni-directional antenna, a monopole antenna, an end fed antenna, a circularly polarized antenna, a micro-strip antenna, a diversity antenna and the like.

Although the scope of the present invention is not limited in this respect, in some embodiments of the invention, PLL unit 130 may include an OPLL unit. According to embodiments of the invention PLL unit 130 may include one or more compensation filters to compensate the closed loop transfer function of the PLL unit 130 if desired.

Although the scope of the present invention is not limited to this embodiment, OPLL unit 130 may provide an RF signal to transceiver 140. For example, transceiver 140 may include at least one GSM receiver and/or at least one GSM transmitter, if desired. Transceiver 140 may receive from OPLL unit 130 the RF signal which may be transmitted through antennas 150 and 160, if desired. It should be understood by persons skilled in the art that transceiver 140 may include any suitable type of a cellular transceiver, a WLAN transceiver, a two-way radio transceiver, a digital radio transceiver, or the like.

Figure 2:
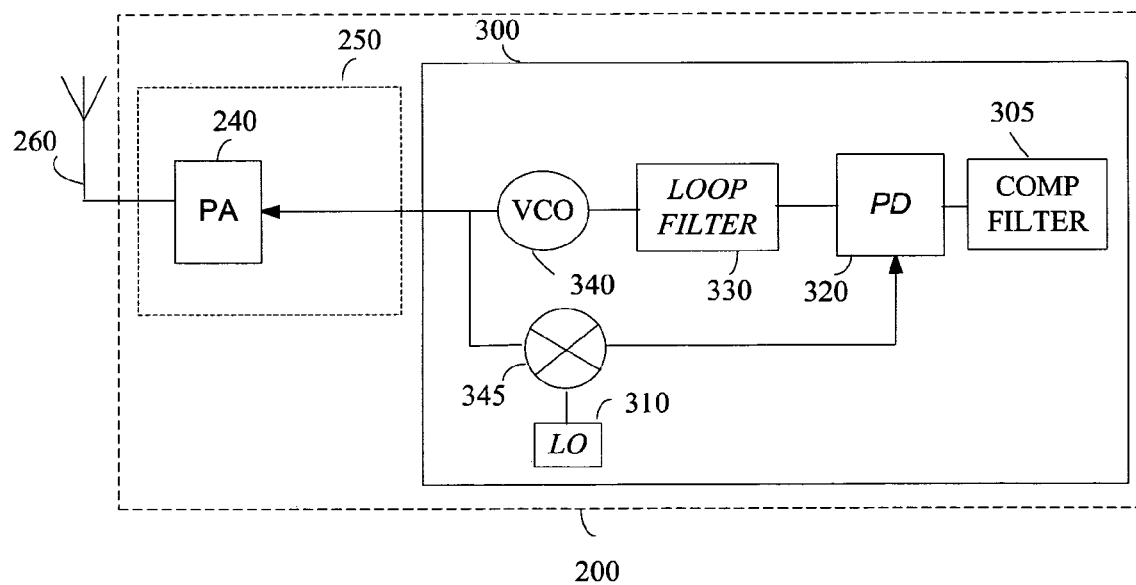
FIG. 2 is a block diagram of a radio device according to some exemplary embodiments of the present invention.

Turning to FIG. 2, a schematic block diagram of a radio device 200 according to an exemplary embodiment of the invention is shown. Although the scope of the present invention is not limited in this respect, radio device 200 may include a PLL unit 300 and a transmitter 250. Transmitter 250 may be able to transmit a signal (e.g. RF signal) via antennas 260 and 270. In some exemplary embodiments of the invention, transmitter 250 may include a power amplifier (PA) 240.

Although the scope of the present invention is not limited in this respect, PLL 300 may include a compensation filter 305, for example, a digital filter, or any other suitable type of filter. According to some embodiments of the present invention, compensation filter 305 may compensate the closed loop transfer function of the PLL unit 300, for example OPLL unit. PLL unit 300 may further include a phase detector PD) 320 to detect a phase of an input signal, a loop filer 330, a voltage controlled oscillator (VCO) 340. A feedback path of PLL unit 300 may include a mixer 345 operably coupled to a local oscillator (LO) 310 and other filters (not shown).

Although the scope of the present invention is not limited in this respect, PLL unit 300 may receive an intermediate frequency (IF) signal. One or more components of PLL unit 300 may upconvert the IF signal into a corresponding signal carried by a final carrier frequency, e.g., a RF signal, if desired. In this embodiment, VCO 340 may upconvert the IF signal into a corresponding RF signal. Mixer 345 and LO 310 may downconvert the RF signal into an IF signal which may be inputted to PD 320. The RF signal may be amplified by PA 240 and may be transmitted via antenna 260, if desired.

Figure 3:
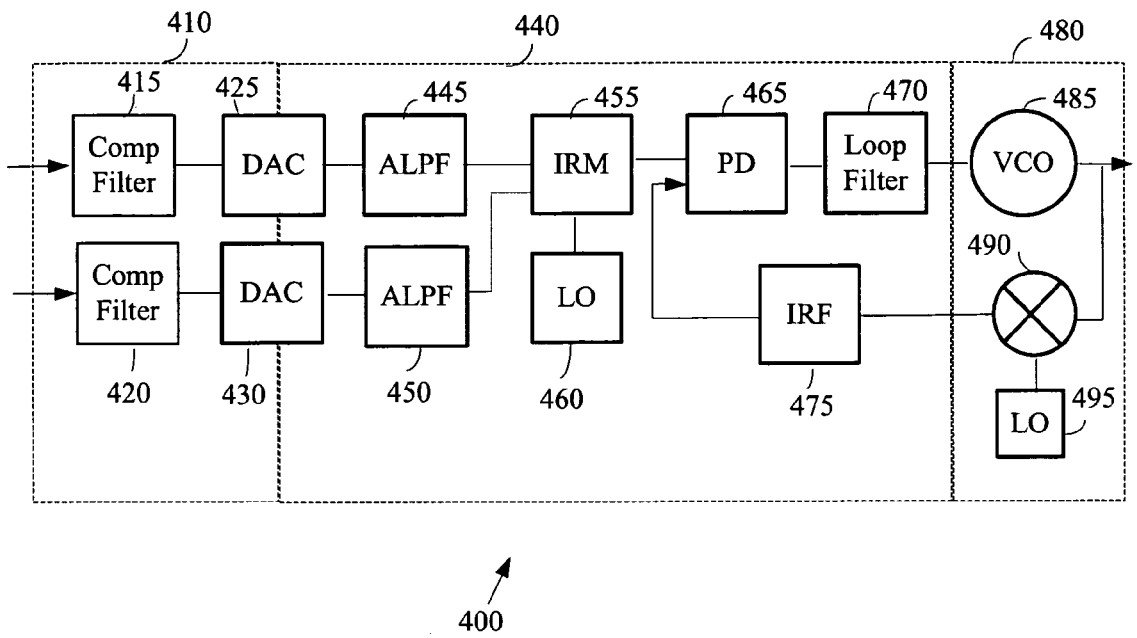
FIG. 3 is a schematic block diagram of an offset phase locked loop according to some exemplary embodiments of the invention.

Turning to FIG. 3 a block diagram of an OPLL unit 400 according to some exemplary embodiments of the invention is shown. Although the scope of the present invention is not limited in this respect, OPLL unit 400 may include a digital section 410, an analog section 440, and a RF section 460. In this exemplary embodiment, digital section 410 may include compensation filters 415, 420 and digital to analog converters (DAC) 425 and 430. Analog section 440 may include analog reconstruction filters (ALPF) 445, 450, an image reject mixer (IRM) 455, a local oscillator (LO) 460, a phase detector (PD) 465, a loop filter 470 and an image reject filter (IRF) 475. RF section 480 may include a VCO 485, a mixer 490 and a LO 495.

According to this exemplary embodiment of the invention, OPLL 400, which may also be referred to as a translation loop transmitter, may translate an input modulated signal into a RF signal at an output terminal of VCO 485. According to some embodiments of the invention, the input modulated signal may include one or more base band signals. In some others embodiment of the present invention, the input modulated signal may include one or more IF signals, although the scope of the present invention in no way limited in this respect.

According to exemplary embodiments of the invention, compensation filters 415, 420 may compensate for the known closed-loop response of the OPLL unit. For example, compensation filters 415, 420 may be designed to yield flat frequency response of the OPLL closed-loop transfer function, if desired. According to other embodiment of the invention, compensation filter 415, 420 may be designed to compensate the closed loop response transfer function of the OPLL unit 400. Furthermore, embodiments of the invention may include compensation filters 415, 420 which include Pre-Emphasis filters, if desired. Furthermore, compensation filter 415 may compensate an in-phase closed loop transfer function of OPLL unit 400 and compensation filter 420 may compensate a quadrature closed loop transfer function of OPLL unit 400.

Although the scope of the present invention is not limited in this respect, compensation filters 415, 420 may be implemented by hardware or by software or by any combination of hardware and/or software. For example, compensation filters 415, 420 may be implemented by a digital signal processor (not shown), if desired.

Although the scope of the present invention is not limited in this respect an exemplary closed loop transfer function H of OPLL 400 may be depicted as follows:

$$H = \frac{\theta_0(s)}{\theta_i(s)} = \frac{K_d K_0 F(s)}{s + K_d K_0 F(s)}$$

Where,
s may be the complex frequency in the Laplas domain (i.e, jω);
Kd may be the phase detector coefficient (in units of [Volt/Rad]);
K0 may be the VCO coefficient (in units of [Hz/Volt]); and
F(s) may be the loop filter's transfer function.

In some exemplary embodiments of the present invention, a digital signal, for example an In-Phase (I) signal, may be inputted to compensation filter 415 and a digital signal, for example a Quadrature phase (Q) signal, may be inputted to compensation filter 415. DACs 425, 430 may convert the filtered I and Q signals into corresponding analog signals. ALPFs 445, 450 may suppress spectral replicas of the converted signals, if desired.

Although the scope of the present invention is not limited in this respect, IRM 455 may include a quadrature modulator. The quadrature modulator may yield a modulated signal, centered at a designated intermediate frequency. In some embodiment of the invention, LO 460 may provide a reference signal, if desired. IRM 455 may combine and upconvert the I and Q signals and may output a modulated signal to PD 465. For example, PD 465 may be implemented in the discrete digital domain by using trigonometric functions, or by exclusive-OR designs or the like.

According to this exemplary embodiment of the invention loop filter 470 may filter a phase detected signal and VCO 485 may upconvert the modulated signal into a corresponding RF signal. Mixer 490, LO 495 for example, a tuned local oscillator and IRF 475 may down convert the RF signal into a feedback signal to be fed to PD 465.

Figure 4:
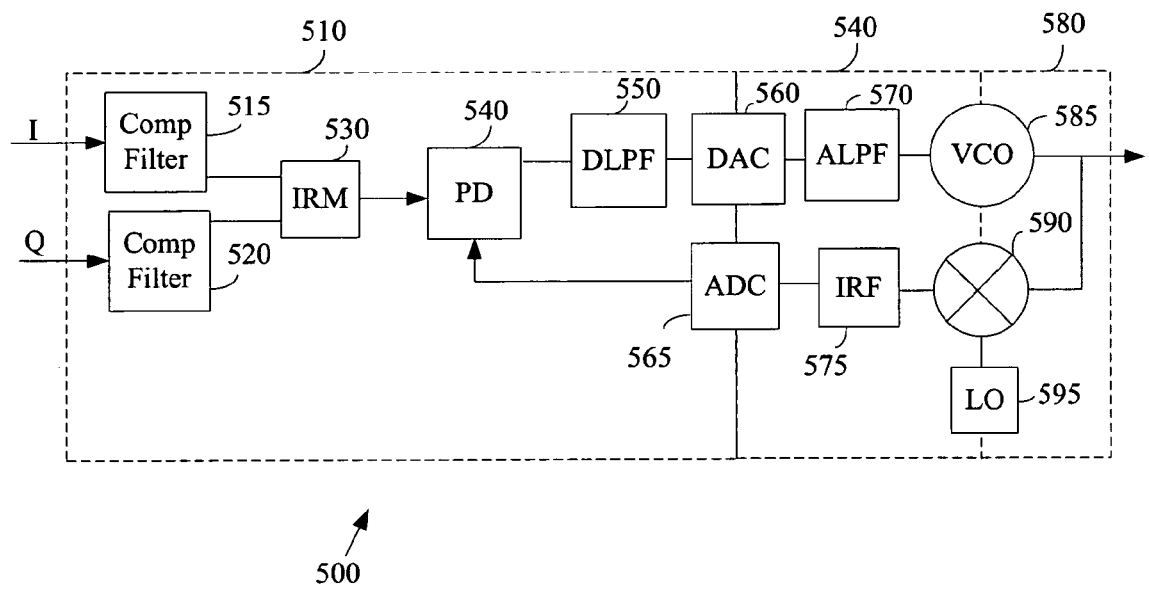
FIG. 4 is a schematic block diagram of an offset phase locked loop according to another exemplary embodiment of the invention.

Turning to FIG. 4 a block diagram of an OPLL 500 according to some other exemplary embodiments of the invention is shown. Although the scope of the present invention is not limited in this respect, OPLL 500 may include a digital section 510, an analog section 540, and an RF section 560. In this exemplary embodiment, digital section 510 may include compensation filters 515, 520, an image rejection modulator (IRM) 530, a phase detector (PD) 540, a digital loop filter 550, a digital to analog converter (DAC) 560, and analog to digital converters (ADC) 565. Analog section 540 may include analog reconstruction filters (ALPF) 570 and an image reject filter (IRF) 475. RF section 580 may include a VCO 585, a mixer 590 and a LO 595.

According to this exemplary embodiment of the invention, digital section 510 may be implemented by digital hardware (e.g. DSP) or by software, or by any combination of hardware and software. Compensation filters 515, 520 may be digital filters which may be able to compensate for the known closed-loop response of OPLL 500. For example, compensation filters 415, 420 may be designed to yield a flat frequency response of the OPLL closed-loop transfer function. According to other embodiment of the invention, compensation filter 515, 520 may be designed to compensate a closed loop response error of a transfer function of OPLL unit 500. Additionally, embodiments of the invention may include compensation filters 515, 520, which may include Pre-Emphasis filters, if desired.

According to this exemplary embodiment, digital signals I and Q may be filtered by compensation filters 515, 520. IRM 520 may digitally combine compensated I and Q signals into a modulated digital signal. However, according to another embodiment of the invention, I and Q signal may be inputted directly to IRM 520 and the IRM may compensate for the closed loop response error of a transfer function of OPLL unit 500, although the scope of the present invention is not limited to this embodiment.

PD 540 may detect a phase of the digital modulated signal. The digital modulate signal may be filtered by DLPF 550. For example, in some embodiments of the invention, DLPF 550 may be a digital filter that operates as a loop-filter for the phase-locked-loop. Furthermore, DLPF 550 may be a software reconfigurable loop filter to configure a closed loop bandwidth of OPLL unit 500. DLPF 550 may be used to attenuate loop noises and/or to shape the closed loop response of the OPLL unit 500, if desired. DAC 560 may convert the digital signal into a corresponding analog signal, and the converted analog signal may be filtered by ALPF 570. VCO 585 may up-convert the converted analog signal into a corresponding RF signal.

Although the scope of the present invention is not limited in this respect, a feedback path of OPLL 500 may include mixer 590, LO 595, IRF 575 and ADC 565. According to these exemplary embodiments, one or more components of the feedback path may down-convert a portion of the RF signal into a digital signal that may be fed to PD 540, although the scope of the present invention is not limited to this exemplary embodiment of the invention.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An offset phase locked loop unit comprising:
   a digital section operably coupled to an analog section which analog section is operably coupled to a Radio Frequency (RF) section, wherein the digital section includes a compensation filter operably coupled to an image reject mixer to compensate for a closed loop response error of a transfer function of the offset phase locked loop unit; the digital section further comprises a software reconfigurable loop filter to configure a closed loop bandwidth of the offset phase locked loop unit and to filter a digital modulated signal; and the analog section further comprises an analog reconstruction filter and an image reject filter.

2. The offset phase locked loop unit of claim 1, wherein the compensation filter comprises:
   a first compensation filter to compensate for an in-phase closed loop response error of a transfer function of the offset phase locked loop; and
   a second compensation filter to compensate for a quadrature closed loop response error of a transfer function of the offset phase locked loop.

3. The offset phase locked loop unit of claim 1, wherein the digital section comprises:
   a phase detector to detect a phase of the digital modulated signal received from the image reject mixer.

4. The offset phase locked loop unit of claim 1, wherein the radio frequency section comprises:
   a voltage controlled oscillator to up-convert an analog signal received from the analog section into a radio frequency signal.

5. The offset phase locked loop unit of claim 4, comprising:
   a mixer operably coupled to a local oscillator to downconvert the radio frequency signal to an intermediate frequency signal, wherein the intermediate frequency signal is feedback in a feedback path into an input of the voltage controlled oscillator.

6. The offset phase locked loop unit of claim 1, wherein said compensation filter is a digital filter to filter a digital signal.

7. The offset phase locked loop unit of claim 2, wherein the first and second compensation filters comprise digital filters to compensate for a known closed-loop response of the offset phase locked loop unit.

8. The offset phase locked loop of claim 2, wherein the first and second compensation filters comprise digital filters to yield a flat frequency response of the offset the phase locked loop closed-loop transfer function.

9. The offset phase locked loop unit of claim 2, wherein the first and second compensation filters comprise digital filters to compensate a closed loop response error of a transfer function of offset phase locked loop unit.

10. The offset phase locked loop unit of claim 2, wherein the first and second compensation filters comprise Pre-Emphasis filters.

11. A method comprising:
   digitally filtering a baseband modulated signal inputted into an offset phase locked loop unit to compensate for a closed loop response error of a transfer function of the offset phase locked loop unit;
   configuring a closed loop bandwidth of the offset phase locked loop unit using a digital software reconfigurable loop filter;
   up-converting the baseband modulated signal into a radio frequency signal by the offset phase locked loop unit and an analog reconstruction filter; and
   down-converting the radio frequency signal using a mixer and an analog image reject filter within the offset phase locked loop unit.

12. The method of claim 11, wherein the baseband modulated signal includes an in-phase signal and a quadrature signal, and wherein the method comprises:
   digitally filtering the in-phase signal and the quadrature signal to compensate for the closed loop response error of a transfer function of the offset phase locked loop unit.

13. A wireless communication device comprising:
   an offset phase locked loop unit comprising an analog section and a digital section, said analog section to upconvert an analog signal into a radio frequency signal, said analog section further comprising an analog reconstruction filter and an image reject filter, said digital section operably coupled to said analog section which analog section is operably coupled to a Radio Frequency (RF) section wherein the digital section includes a compensation filter operably coupled to an image reject mixer to compensate a close loop response error of a transfer function of the offset phase locked loop unit, and the digital section further comprises a software reconfigurable loop filter to configure a closed loop bandwidth of the offset phase locked loop unit and to filter a digital modulated signal;
   an RF section including a transmitter operably coupled to the offset phase locked loop unit; and
   a dipole antenna to operably coupled to the transmitter transmit a signal.

14. The wireless communication device of claim 13, wherein said compensation filter comprises:
- a first compensation filter to compensate an in-phase closed loop response error of a transfer function of the offset phase locked loop; and
- a second compensation filter to compensate a quadrature closed loop response error of a transfer function of the offset phase locked loop.

15. The wireless communication device of claim 13, wherein the offset phase locked loop unit comprises:
- a phase detector to detect a phase of the digital modulated signal received from the image reject mixer.

16. The wireless communication device of claim 13, wherein the offset phase locked loop unit comprises:
- a voltage controlled oscillator to up-convert the analog signal into the radio frequency signal; and
- a mixer operably coupled to a local oscillator to downconvert the radio frequency signal to an intermediate frequency signal, wherein the intermediate frequency signal is feedback into an input of the voltage controlled oscillator.

17. The wireless communication device of claim 13, wherein said compensation filter is a digital filter.

18. The wireless communication device of claim 14, wherein said first and second compensation filters comprise digital filters.

19. A wireless communication system comprising:
a base station; and
a mobile station comprising:
- an offset phase locked loop unit comprising an analog section and a digital section, said analog section to upconvert an analog signal into a radio frequency signal, the analog section further comprising an analog reconstruction filter and an image reject filter, said digital section operably coupled to said analog section which analog section is operably coupled to a Radio Frequency (RF) section, wherein the digital section includes a compensation filter operably coupled to an image reject mixer to compensate for a closed loop response error of a transfer function of the offset phase locked loop unit, and the digital section further comprises a software reconfigurable loop filter to configure a closed loop bandwidth of the offset phase locked loop unit and to filter a digital modulated signal; and
- an RF section including a transmitter operably coupled to the offset phase locked unit to transmit the radio frequency signal to the base station.

20. The wireless communication system of claim 19, wherein said compensation filter comprises:
- a first compensation filter to compensate an in-phase closed loop response error of a transfer function of the offset phase locked loop; and
- a second compensation filter to compensate a quadrature closed loop response error of a transfer function of the offset phase locked loop.

21. The wireless communication system of claim 19, wherein the phase locked loop unit comprises:
- a phase detector to detect a phase of the digital modulated signal received from the image reject mixer.

22. The wireless communication system of claim 19, wherein the phase locked loop unit comprises:
- a voltage controlled oscillator to up-convert the analog signal into the radio frequency signal; and
- a mixer operably coupled to a local oscillator to downconvert the radio frequency signal to an intermediate frequency signal, wherein the intermediate frequency signal is feedback into an input of the voltage controlled oscillator.

23. The wireless communication system of claim 19, wherein said compensation filter comprises a digital filter.

24. The wireless communication system of claim 20, wherein said first and second compensation filters comprise digital filters.

* * * * *

UNITED STATES PATENT AND TRADEMARK OFFICE
CERTIFICATE OF CORRECTION

| | | |
|---|---|---|
| PATENT NO. | : 7,502,602 B2 | Page 1 of 1 |
| APPLICATION NO. | : 11/183835 | |
| DATED | : March 10, 2009 | |
| INVENTOR(S) | : Wolf | |

It is certified that error appears in the above-identified patent and that said Letters Patent is hereby corrected as shown below:

On the Title page, in Item (56), under "Other Publications", in column 2, line 1, delete "freqency" and insert -- frequency --, therefor.

In column 6, line 15, in Claim 8, delete "loop" and insert -- loop unit --, therefor.

Signed and Sealed this

Sixteenth Day of March, 2010

David J. Kappos
*Director of the United States Patent and Trademark Office*